United States Patent
JangJian et al.

(10) Patent No.: US 9,673,244 B2
(45) Date of Patent: Jun. 6, 2017

(54) IMAGE SENSOR ISOLATION REGION AND METHOD OF FORMING THE SAME

(75) Inventors: Shiu-Ko JangJian, Tainan (TW); Min Hao Hong, Kaohsiung (TW); Kei-Wei Chen, Tainan (TW); Szu-An Wu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 854 days.

(21) Appl. No.: 13/415,546

(22) Filed: Mar. 8, 2012

(65) Prior Publication Data

US 2013/0234202 A1 Sep. 12, 2013

(51) Int. Cl.
*H01L 31/109* (2006.01)
*H01L 27/146* (2006.01)

(52) U.S. Cl.
CPC ...... *H01L 27/1463* (2013.01); *H01L 27/1464* (2013.01)

(58) Field of Classification Search
USPC .......... 257/184, 292, E21.352, E27.133, 257/E31.084; 438/69, 72, 73, 237, 439
See application file for complete search history.

(56) References Cited

U.S. PATENT DOCUMENTS

| | | | | |
|---|---|---|---|---|
| 7,638,347 B2* | 12/2009 | Lee | ............... | H01L 27/1463 257/E21.551 |
| 7,872,284 B2* | 1/2011 | Mouli | ............... | H01L 27/14609 257/225 |
| 8,119,439 B2* | 2/2012 | Park | ............... | H01L 27/14627 257/E21.04 |
| 2007/0045684 A1 | 3/2007 | Lee | | |
| 2010/0279459 A1 | 11/2010 | Huang et al. | | |
| 2013/0037856 A1* | 2/2013 | He | ............... | H01L 29/161 257/190 |
| 2013/0234202 A1 | 9/2013 | JangJian et al. | | |
| 2013/0280849 A1 | 10/2013 | JangJian et al. | | |

* cited by examiner

*Primary Examiner* — Kenneth Parker
*Assistant Examiner* — Warren H Kilpatrick
(74) *Attorney, Agent, or Firm* — Slater Matsil, LLP

(57) ABSTRACT

Image sensors comprising an isolation region according to embodiments are disclosed, as well as methods of forming the image sensors with isolation region. An embodiment is a structure comprising a semiconductor substrate, a photo element in the semiconductor substrate, and an isolation region in the semiconductor substrate. The isolation region is proximate the photo element and comprises a dielectric material and an epitaxial region. The epitaxial region is disposed between the semiconductor substrate and the dielectric material.

20 Claims, 4 Drawing Sheets

IMAGE SENSOR ISOLATION REGION AND METHOD OF FORMING THE SAME

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and any necessary logic, such as amplifiers, A/D converters, or the like.

CMOS image sensors generally are pixelated metal oxide semiconductors. A CMOS image sensor typically comprises an array of light sensitive picture elements (pixels), each of which may include transistors, capacitors, and a photosensitive element. A CMOS image sensor utilizes light-sensitive CMOS circuitry to convert photons into electrons. The light-sensitive CMOS circuitry typically comprises a photo diode formed in a substrate. As the photo diode is exposed to light, an electrical charge is induced in the photo diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers, such as dielectric layers and interconnect metal layers, formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front side illuminated (FSI) image sensors and backside illuminated (BSI) image sensors.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure describes embodiments in a specific context, namely a backside illuminated image sensor. Other embodiments may also be applied, however, to a variety of image sensors, such as a front side illuminated image sensor or the like. Hereinafter, various embodiments will be explained in detail with reference to the accompanying drawings. Although various steps of a disclosed method may be discussed in a particular order, other methods may be performed in any logical order.

Figure 1:
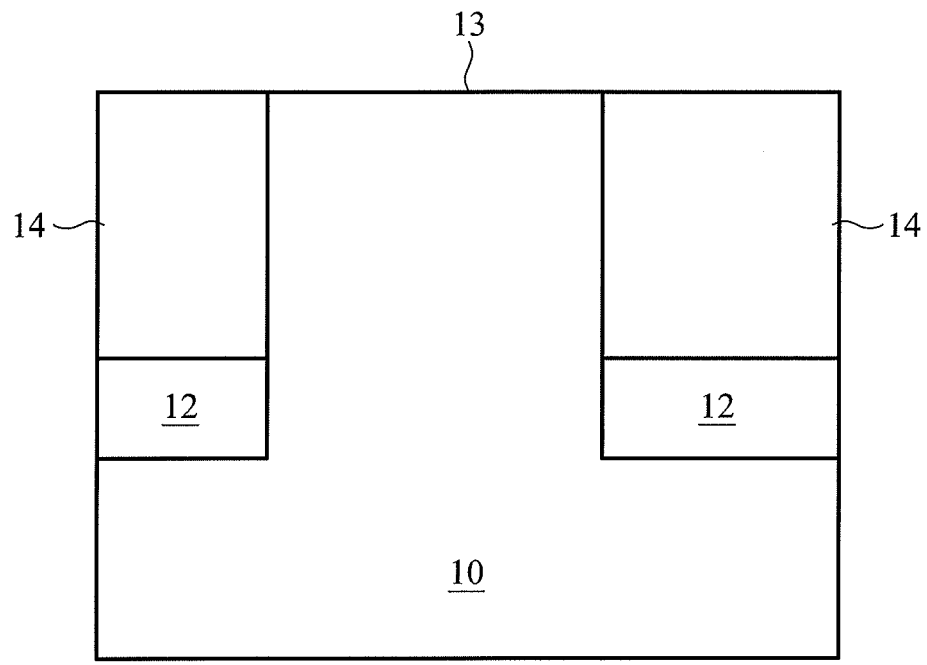
FIGS. 1 through 8 are cross sectional views of a method of forming a backside illuminated image sensor in accordance with an embodiment.

FIG. 1 illustrates a cross sectional view of a substrate 10 of a pixel of an image sensor during processing. The substrate 10 includes a lightly p-type doped epitaxial layer over a highly p-type doped silicon substrate, for example. In other embodiments, the substrate 10 may include silicon, germanium, silicon germanium, graded silicon germanium, a bulk semiconductor material, a semiconductor-on-insulator, carbon, quartz, sapphire, glass, or the like, and may be multi-layered (e.g., strained layers). A deep p-well (DPW) region 12 is formed in the substrate 10, and a cell p-well (CPW) region 14 is formed over the DPW region 12 in the substrate 10. The DPW region 12 and the CPW region 14 are components of an isolation region formed in the substrate 10 to prevent cross-talk between adjacent pixels. The DPW region 12 and CPW region 14 are formed by, for example, implanting p-type dopants, such as boron or the like, through a front side 13 of the substrate 10. In an embodiment, a p-type doping concentration of the CPW region 14 is greater than a p-type doping concentration of the DPW region 12. The DPW region 12 can have a doping concentration in a range from about $10^{13}/cm^3$ to about $10^{18}/cm^3$. The CPW region 14 can have a doping concentration in a range from about $10^{15}/cm^3$ to about $10^{19}/cm^3$.

Figures 2, 3, 4:
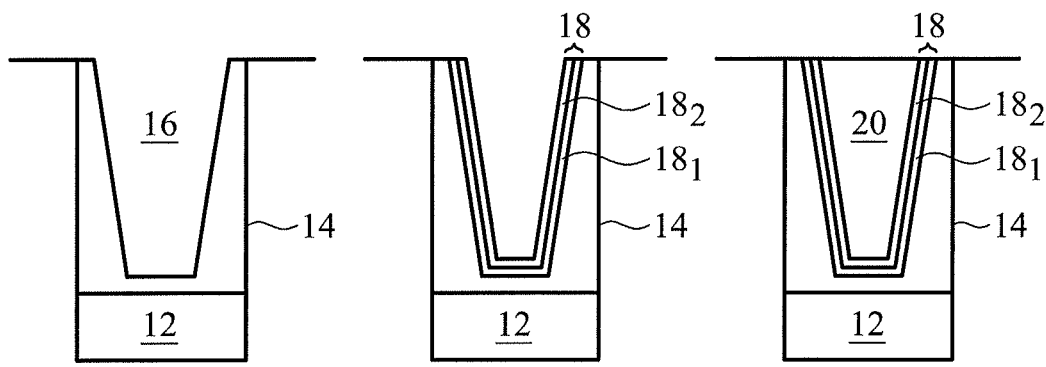

FIGS. 2 through 4 are cross sectional views of the CPW region 14 in which a trench isolation is formed according to an embodiment. In FIG. 2, a trench 16 is etched in the CPW region 14 in the substrate 10. The etch may be performed using acceptable photolithography techniques. Although not explicitly illustrated, a mask can be used during the photolithography process and used during a subsequent epitaxial growth to prevent nucleation outside of the trench 16.

In FIG. 3, an epitaxial layer 18 (including first portion $18_1$ and second portion $18_2$) is epitaxially grown on the surfaces of the substrate 10 in the trench 16. In an embodiment, the epitaxial layer 18 is silicon germanium (SiGe) layer, such as $Si_{0.99-0.98}Ge_{0.01-0.02}$. In this embodiment where the substrate 10 is silicon, including epitaxial silicon, the SiGe layer can induce a stress, such as a compressive stress, in the substrate 10. Accordingly, the epitaxial layer 18 can be lattice mismatched with the substrate 10 and can induce a stress, such as compressive or tensile, in the substrate 10. Other acceptable materials can be used for the epitaxial layer 18. The epitaxial layer 18 can be deposited by appropriate epitaxial growth processes, such as selective epitaxial growth (SEG), molecular beam epitaxy (MBE), metalorganic chemical vapor deposition (MOCVD), the like, or a combination thereof.

In an embodiment, a first portion $18_1$ of the epitaxial layer 18 is grown from the substrate 10 without doping, and a second portion $18_2$ of the epitaxial layer 18 is grown from the first portion $18_1$ with in situ doping during the growth. In an embodiment, the dopant is a p-type dopant, such as boron or the like, although a different dopant type, such as n-type can be used for other applications. More specifically, in an embodiment, the first portion $18_1$ of the epitaxial layer 18 is SiGe, and the second portion $18_2$ of the epitaxial layer 18 is SiGe doped with boron. In these embodiments, the epitaxial growth can begin without a dopant for the growth of the first portion, and the epitaxial growth can be later changed to include a dopant for the growth of the second portion. In other embodiments, the entirety of the epitaxial layer 18 can be doped, with a p-type or n-type dopant, or none of the epitaxial layer 18 can be doped.

The epitaxial layer 18 can repair damage to the substrate 10 that can be caused by the trench etch. By repairing the damage to the substrate 10, detrimental leakage current that could otherwise occur by the damage is generally reduced.

Figure 5:
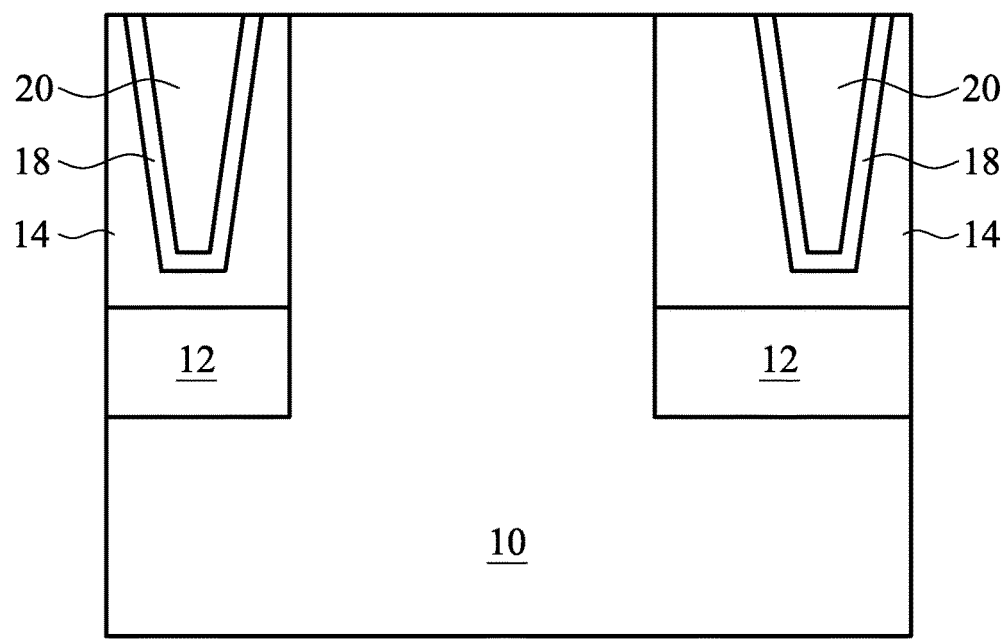

In FIG. 4, a dielectric material 20, such as an oxide, is deposited in the trench 16 over the epitaxial layer 18. The dielectric material 20 can be deposited by a high density plasma chemical vapor deposition (HDP-CVD), plasma enhanced chemical vapor deposition (PECVD), a thermal CVD, the like, or a combination thereof. Further, the dielectric material 20 can be any dielectric material formed by an acceptable process. A planarization, such as by a chemical mechanical polish (CMP), may be performed on the front side after the deposition of the dielectric material 20. FIG. 5 illustrates the formed isolation regions, including the DPW region 12, CPW region 14, epitaxial layer 18, and dielectric material 20 formed in the substrate 10 of FIG. 1.

Figure 6:
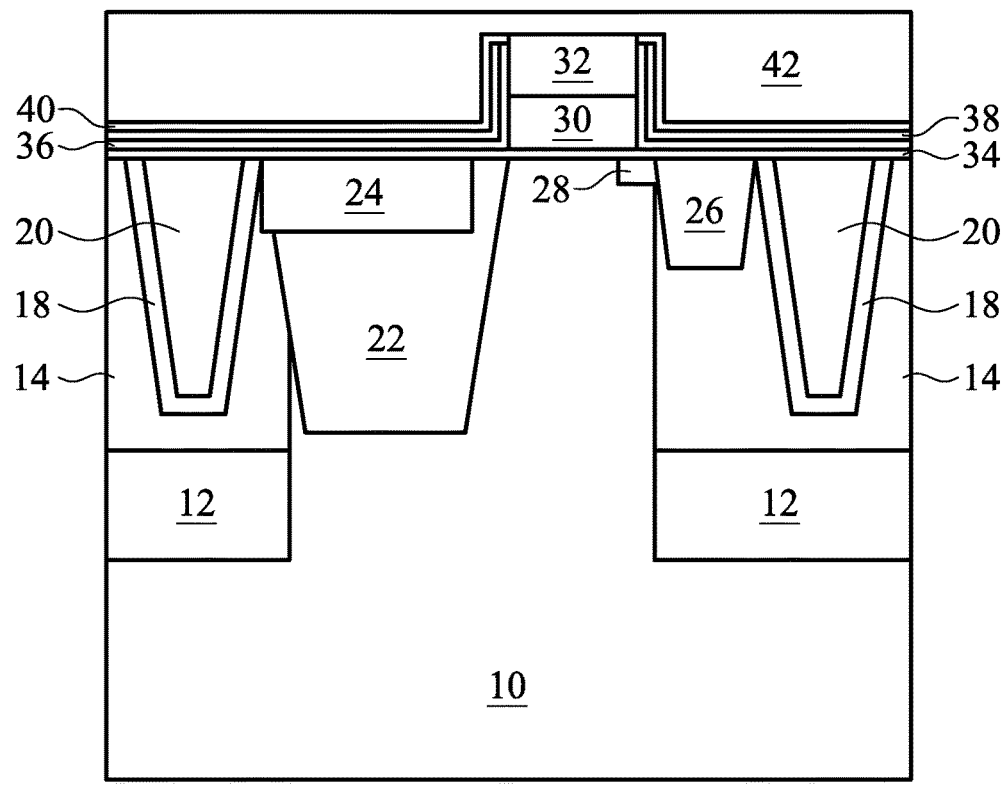

FIG. 6 is a cross sectional view of the substrate 10 after further processing according to an embodiment. A photo diode is formed in the substrate 10. The photo diode comprises an n-type region 22 and a p-type region 24 that form a p-n junction. The n-type region 22 has an n-type dopant concentration of, for example, between about $10^{15}/cm^3$ and about $10^{19}/cm^3$, and the p-type region 24 has a p-type dopant concentration of, for example, between about $10^{16}/cm^3$ and about $10^{20}/cm^3$. The photo diode is formed proximate one of the isolation regions. A source/drain region 26 is formed in the substrate 10 in the CPW region 14 of the other illustrated isolation region. The source/drain region 26 in this example is an n-type region having an n-type dopant concentration of, for example, between about $10^{16}/cm^3$ and about $10^{20}/cm^3$. An extension region 28 extends from the source/drain region 26, and has an n-type dopant concentration of, for example, between about $10^{18}/cm^3$ and about $10^{22}/cm^3$. These regions 22, 24, 26, and 28 can be formed by appropriate implantation through the front side 13.

A gate dielectric layer 34 is formed on the front side 13 over the substrate 10. A gate electrode layer, such as polysilicon or the like, is deposited over the gate dielectric layer 34 and patterned into a gate electrode 30. The gate electrode 30 comprises an n-type doped upper region 32 formed by implantation, in situ doping during deposition, or the like, and has an n-type dopant concentration, for example, between about $10^7/cm^3$ and about $10^{14}/cm^3$. The gate electrode 30 is laterally between the photo diode and the source/drain region 26, and partially over the extension region 28. A dielectric layer 36, such as tetraethyl orthosilicate (TEOS) or the like, is conformally deposited over the substrate 10 and the gate electrode 30, and a resist protective layer (RPL) 38, such as silicon oxide or the like, is conformally deposited over the dielectric layer 36. The dielectric layer 36 and RPL 38 can be etched to expose a top surface of the gate electrode 30 and are recessed below the top surface of the gate electrode 30. An etch stop layer (ESL) 40, such as silicon nitride or the like, is conformally deposited over the RPL 38. An inter-layer dielectric (ILD) 42, such as silicon oxide, borophosphosilicate glass (BPSG), phosphosilicate glass (PSG), fluorinated silicate glass (FSG), carbon-doped silicon oxide, or the like, is deposited over the ESL 40. The ILD 42 can be planarized using, for example, a CMP. These components can be formed with any acceptable deposition process.

Contacts (not explicitly illustrated) can be formed through the ILD 42 to the substrate 10. For example, openings can be etched using acceptable photolithography techniques, and conductive materials, such as a copper, aluminum, or the like, with or without a barrier layer, can be deposited into the openings. A polishing and/or grinding process, such as a CMP, can remove excess conductive materials and leave the contacts in the openings.

Figure 7:
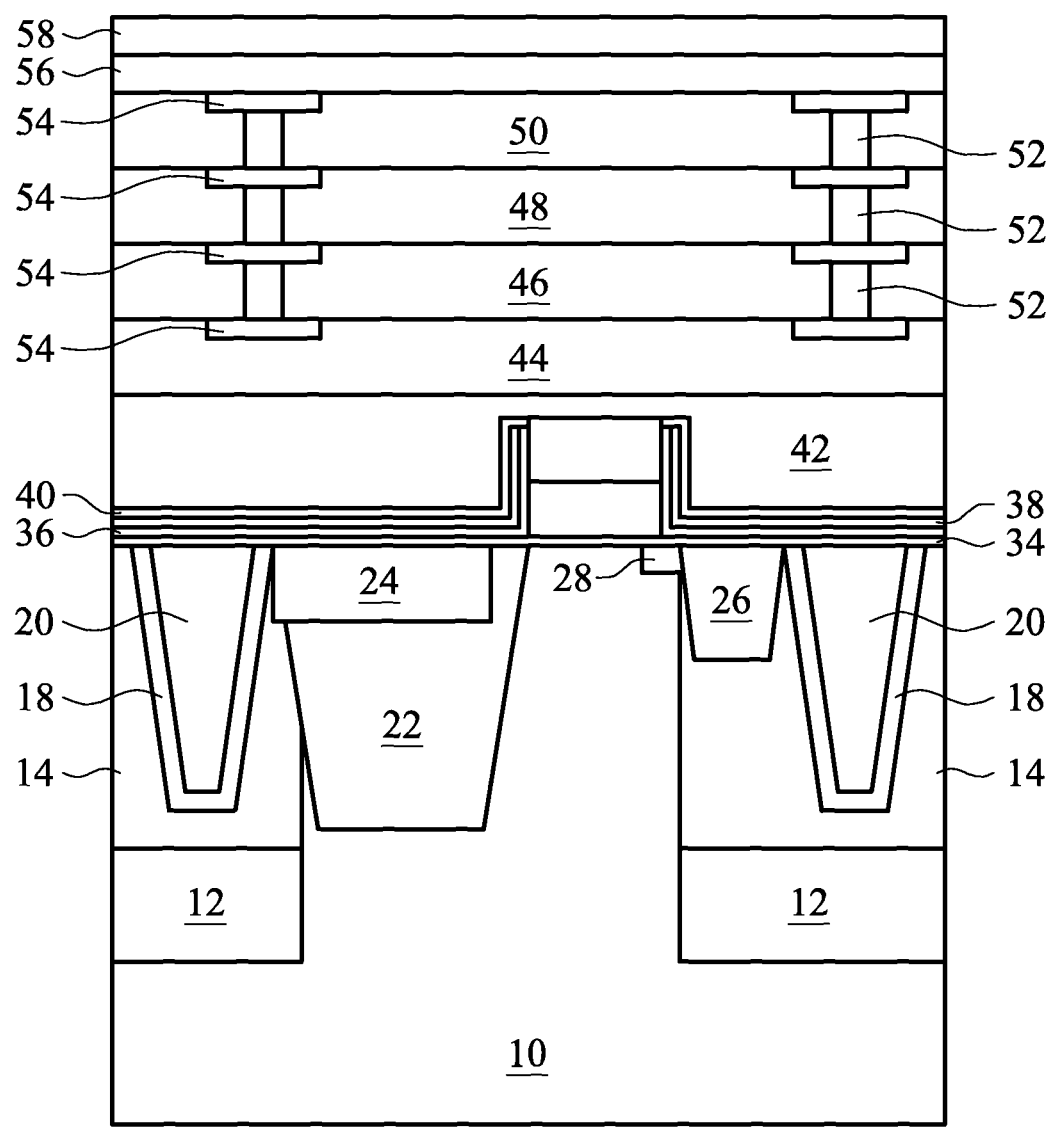

As shown in the cross sectional view of FIG. 7, subsequent inter-metal dielectrics (IMDs) 44, 46, 48, and 50 having metallization patterns 54 and vias 52 are formed over the ILD 42. Each of the IMDs 44, 46, 48, and 50 can be silicon oxide, BPSG, PSG, FSG, the like, or a combination thereof, formed by CVD, HDP-CVD, furnace deposition, PECVD, the like, or a combination thereof. The vias 52 and metallization patterns 54 in each of the IMDs 44, 46, 48, and 50 can be formed using, for example, a damascene process like a dual damascene. Conductive materials, such as aluminum, copper, or the like, with or without a barrier layer, can be used as the vias 52 and metallization patterns 54 and can be deposited using, for example, CVD, atomic layer deposition (ALD), physical vapor deposition (PVD), the like, or a combination thereof. A polishing and/or grinding process, such as a CMP, can remove excess conductive materials. The IMDs 44, 46, 48, and 50 are sequentially formed, along with the respective vias 52 and metallization patterns 54.

A first passivation layer 56 is formed over the top IMD 50, and a second passivation layer 58 is formed over the first passivation layer 56. The passivation layers 56 and 58 can be silicon nitride, silicon carbide, silicon oxide, the like, or a combination thereof, deposited by CVD or the like. It should be noted that many other components may be included in an embodiment that are not expressly depicted. For example, etch stop layers can be disposed between the various interfaces between layers of the ILD 42 and IMDs 44, 46, 48, and 50. Further, more or fewer IMDs can be used.

Figure 8:
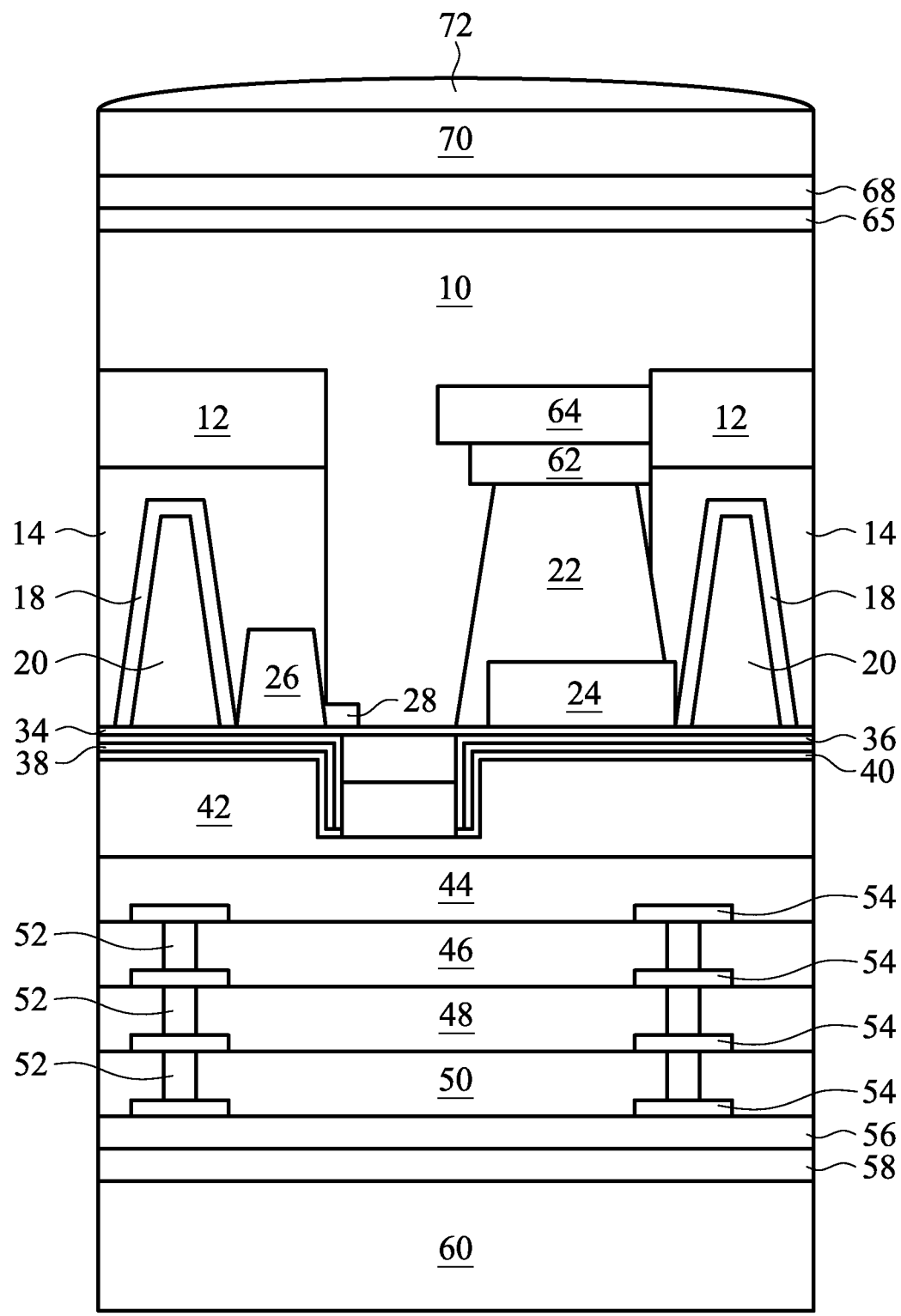

FIG. 8 is a cross sectional view after the substrate 10 is flipped and bonded on a carrier 60. Once the passivation layers 56 and 58 are formed, the substrate 10 is flipped and bonded on the carrier 60, which may be silicon, glass, or the like. In particular, the front side 13 of the substrate 10 faces toward the carrier 60. Various bonding techniques may be employed to achieve bonding between front side 13 of the substrate 10, e.g., the second passivation layer 58, and the carrier 60. Suitable bonding techniques may include adhesive bonding, vacuum bonding, anodic bonding, or the like. The carrier 60 may provide sufficient mechanical support to resist forces due to a grinding step of a thinning process.

A thinning process is performed on a backside of the substrate 10. The substrate 10 is thinned until the lightly doped p-type epitaxial layer of the substrate 10 is exposed from the backside 65. A thin substrate 10 allows more light to pass through the substrate 10 and hit photo diodes embedded in the substrate 10 without being absorbed by the substrate 10. The thinning process may be implemented by using suitable techniques, such as grinding, polishing and/or chemical etching.

Deep n-type regions 62 and 64 are formed in the substrate 10 by an ion implantation into the substrate 10 through the backside 65 of the substrate 10. The deep n-type region 62 is disposed between the deep n-type region 64 and the n-type region 22 of the photo diode. The deep n-type region 62 can have a doping concentration in a range from about $10^{15}/cm^3$ to about $10^{18}/cm^3$. The deep n-type region 64 can have a doping concentration in a range from about $10^{14}/cm^3$ to about $10^{17}/cm^3$. As a result, an extended photo active region is formed.

A thin p+ layer 66 is formed on the backside 65 of the substrate 10. The thin p+ layer is formed by an ion implantation through the backside 65 of the substrate 10, and has a p-type dopant concentration from about $10^{17}/cm^3$ to about $10^{22}/cm^3$. The thin p+ layer 66 may be formed on the backside 65 of the substrate 10 to increase the number of photons converted into electrons. In order to repair crystal defects that can be caused by ion implantation and to activate the implanted ions, a laser annealing process may be performed on the backside of the substrate 10.

A dielectric layer 68 is formed over the thin p+ layer 66. The dielectric layer 68 can be a silicon nitride, silicon oxide, silicon oxynitride, silicon oxycarbide, a high-k dielectric such as dielectrics with a dielectric constant greater than 2, the like, or a combination thereof, deposited by CVD, metalorganic chemical vapor deposition (MOCVD), ALD, the like, or a combination thereof. A color filter layer 70 is formed over the dielectric layer 68. The color filter layer 70 may be used to allow specific wavelengths of light to pass while reflecting other wavelengths, thereby allowing the image sensor to determine the color of the light being received by the photo diode. The color filter layer 70 may vary, such as a red, green, and blue filter. Other combinations, such as cyan, yellow, and magenta, may also be used. The number of different colors of the color filter layer 70 may also vary. The color filter layer 70 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 70. Other materials, however, may be used. The color filter layer 70 may be formed by any suitable method.

A microlens layer 72 is formed over the color filter layer 70. The microlens layer 72 may be formed of any material that may be patterned and formed into lenses, such as a high transmittance, acrylic polymer. In an embodiment, the microlens layer 72 may be formed using a material in a liquid state and spin-on techniques. This method has been found to produce a substantially planar surface and a microlens layer 72 having a substantially uniform thickness, thereby providing greater uniformity in the microlenses. Other methods, such as deposition techniques like CVD, PVD, or the like, may also be used.

An embodiment is a structure comprising a semiconductor substrate, a photo element in the semiconductor substrate, and an isolation region in the semiconductor substrate. The isolation region is proximate the photo element and comprises a dielectric material and an epitaxial region. The epitaxial region is disposed between the semiconductor substrate and the dielectric material.

Another embodiment is a structure comprising a photo diode in a substrate, an epitaxial layer on a surface of a trench in the substrate, and an isolation material on the epitaxial layer. The trench is proximate the photo diode. The epitaxial layer is disposed between the isolation material and the substrate.

A further embodiment is a method comprising forming a recess in a substrate; epitaxially growing a regrowth layer on a surface of the recess; forming an isolation material on the regrowth layer; and forming a photo element in the substrate.

Although embodiments of the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a semiconductor substrate;
a photo element in the semiconductor substrate; and
an isolation region in the semiconductor substrate proximate the photo element, the isolation region comprising a dielectric material and an epitaxial region, the epitaxial region being disposed between the semiconductor substrate and the dielectric material, wherein the epitaxial region comprises a material that is lattice mismatched to a substrate material of the semiconductor substrate.

2. A structure comprising:
a semiconductor substrate;
a photo element in the semiconductor substrate; and
an isolation region in the semiconductor substrate proximate the photo element, the isolation region comprising a dielectric material and an epitaxial region, the epitaxial region being disposed between the semiconductor substrate and the dielectric material, the epitaxial region comprising a doped sub-region and an un-doped sub-region, wherein the un-doped sub-region is disposed adjacent a semiconductor sidewall of the semiconductor substrate and between the semiconductor substrate and the doped sub-region, the doped sub-region being disposed adjacent the un-doped sub-region and between the un-doped sub-region and the dielectric material.

3. The structure of claim 2, wherein the doped sub-region comprises p-type doped silicon germanium, and the un-doped region comprises silicon germanium, and wherein the semiconductor substrate comprises silicon.

4. The structure of claim 1, wherein the epitaxial region induces a stress in the semiconductor substrate.

5. The structure of claim 1, wherein the epitaxial region is along surfaces of a trench in the semiconductor substrate.

6. A structure comprising:
a photo diode in a substrate;
an epitaxial layer on a surface of a trench in the substrate, the trench being proximate the photo diode, wherein the epitaxial layer comprises a material that is lattice mismatched to the substrate; and
an isolation material on the epitaxial layer, the epitaxial layer being disposed between the isolation material and the substrate.

7. The structure of claim 6, wherein the epitaxial layer comprises a first sub-layer and a second sub-layer, the first sub-layer being proximate to the substrate, and the second sub-layer being distal from the substrate, a dopant concentration of the second sub-layer being greater than a dopant concentration of the first sub-layer.

8. The structure of claim 6, wherein the epitaxial layer comprises silicon germanium and a p-type dopant, a concentration of the p-type dopant increasing in a direction from the surface of the trench toward a region distal from the surface, and wherein the substrate comprises silicon.

9. The structure of claim 6, wherein the epitaxial layer induces a stress in the substrate.

10. A structure comprising:
a semiconductor substrate;
a photo element comprising a p-n junction and extending from a first side of the semiconductor substrate into the semiconductor substrate;
a p-doped well adjacent to the p-n junction and extending from the first side of the semiconductor substrate into the semiconductor substrate; and
an isolation structure in the p-doped well, the isolation structure comprising an epitaxial layer on a sidewall surface of a trench and an isolation material on the epitaxial layer, at least a first portion of the epitaxial layer being p-doped.

11. The structure of claim 10, wherein the first portion of the epitaxial layer is distal from the sidewall surface of the trench, a second portion of the epitaxial layer being disposed between the first portion of the epitaxial layer and the sidewall surface, the second portion not being doped.

12. The structure of claim 10, wherein the epitaxial layer comprises a crystalline material with lattice spacing different from a lattice spacing of a crystalline material of the semiconductor substrate.

13. The structure of claim 10, wherein the epitaxial layer induces a stress in the semiconductor substrate.

14. The structure of claim 10, wherein the semiconductor substrate comprises silicon, and the epitaxial layer comprises silicon germanium.

15. The structure of claim 10 further comprising:
at least one metallization dielectric layer comprising a metallization pattern on the first side of the semiconductor substrate; and
a lens and a filter on a second side of the semiconductor substrate, the second side being opposite the first side.

16. The structure of claim 1 further comprising:
at least one metallization dielectric layer comprising a metallization pattern on a first side of the semiconductor substrate; and
a lens and a filter on a second side of the semiconductor substrate, the second side being opposite the first side.

17. The structure of claim 6 further comprising:
at least one metallization dielectric layer comprising a metallization pattern on a first side of the substrate; and
a lens and a filter on a second side of the substrate, the second side being opposite the first side.

18. The structure of claim 1 further comprising a p-well disposed in the semiconductor substrate, the isolation region being disposed in the p-well, and the photo element being proximate the p-well and not disposed in the p-well.

19. The structure of claim 2 further comprising a p-well disposed in the semiconductor substrate, the isolation region being disposed in the p-well, and the photo element being proximate the p-well and not disposed in the p-well.

20. The structure of claim 6 further comprising a p-well disposed in the substrate, the trench being disposed in the p-well, and the photo diode being proximate the p-well and not disposed in the p-well.

* * * * *